(12) United States Patent
Tani (10) Patent No.: US 11,050,007 B2
(45) Date of Patent: Jun. 29, 2021

(54) LIGHT EMITTING DEVICE

(71) Applicant: NICHIA CORPORATION, Anan (JP)

(72) Inventor: Naohiko Tani, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/567,711

(22) Filed: Sep. 11, 2019

(65) Prior Publication Data

US 2020/0105982 A1    Apr. 2, 2020

(30) Foreign Application Priority Data

Sep. 28, 2018   (JP) .............................. JP2018-183357

(51) Int. Cl.
| | | |
|---|---|---|
| *H01L 33/58* | (2010.01) | |
| *H01L 33/50* | (2010.01) | |
| *H01L 33/62* | (2010.01) | |
| *H01L 33/60* | (2010.01) | |
| *H01L 25/075* | (2006.01) | |

(52) U.S. Cl.
CPC ........ *H01L 33/505* (2013.01); *H01L 25/0753* (2013.01); *H01L 33/60* (2013.01); *H01L 33/62* (2013.01)

(58) Field of Classification Search
CPC ..... H01L 2933/0058; H01L 2933/0091; H01L 33/505; H01L 33/54; H01L 33/58; H01L 33/48–58; H01L 33/52; H01L 33/507; G02F 1/133526

See application file for complete search history.

(56) References Cited

U.S. PATENT DOCUMENTS

| | | | | |
|---|---|---|---|---|
| 2010/0012955 | A1* | 1/2010 | Sorg | .................... H01L 25/0753 257/88 |
| 2010/0320928 | A1* | 12/2010 | Kaihotsu | ................ H05B 45/20 315/250 |
| 2012/0319563 | A1 | 12/2012 | Ishihara et al. | |
| 2013/0329440 | A1 | 12/2013 | Tsutsumi et al. | |
| 2014/0131753 | A1 | 5/2014 | Ishida et al. | |
| 2014/0226308 | A1 | 8/2014 | Fukuda et al. | |

(Continued)

FOREIGN PATENT DOCUMENTS

| | | |
|---|---|---|
| JP | 2012004475 A | 1/2012 |
| JP | 2012-134355 A | 7/2012 |

(Continued)

*Primary Examiner* — Matthew C Landau
*Assistant Examiner* — Eric K Ashbahian
(74) *Attorney, Agent, or Firm* — Global IP Counselors, LLP (57) ABSTRACT

A light emitting device includes a plurality of light emitting elements each including a light extraction surface, a plurality of phosphor layers each covering the light extraction surface of a corresponding one of the light emitting elements with a larger plane area than the light extraction surface, and a plurality of light transmissive members. Each of the light transmissive members has a lower surface facing a corresponding one of the phosphor layers and having a larger plane area than the light extraction surface of a corresponding one of the light emitting elements, an upper surface having a larger plane area than the lower surface, and a side surface having a vertical surface portion contiguous with the upper surface. The light reflecting member surrounds the side surface of each of the light transmissive members.

20 Claims, 4 Drawing Sheets

(56) References Cited

U.S. PATENT DOCUMENTS

| | | |
|---|---|---|
| 2015/0263239 A1 | 9/2015 | Watanabe |
| 2015/0340547 A1 | 11/2015 | Tamaki |
| 2016/0093777 A1* | 3/2016 | Sato .................. H01L 33/505 257/98 |
| 2016/0163931 A1 | 6/2016 | Schricker et al. |
| 2016/0268471 A1 | 9/2016 | Endo et al. |
| 2016/0380165 A1* | 12/2016 | Miyoshi ............... H01L 33/505 438/28 |
| 2017/0062681 A1* | 3/2017 | Miyoshi .................. H01L 33/60 |
| 2017/0098743 A1 | 4/2017 | Chen et al. |
| 2017/0133562 A1 | 5/2017 | Ling et al. |
| 2017/0222107 A1 | 8/2017 | Chen et al. |
| 2018/0040786 A1 | 2/2018 | Chen |
| 2018/0175264 A1* | 6/2018 | Lee ...................... H01L 33/58 |
| 2019/0288168 A1* | 9/2019 | Kong ..................... H01L 33/48 |

FOREIGN PATENT DOCUMENTS

| | | |
|---|---|---|
| JP | 2012138454 A | 7/2012 |
| JP | 2012-169189 A | 9/2012 |
| JP | 2013004802 A | 1/2013 |
| JP | 2014-120722 A | 6/2014 |
| JP | 2014197690 A | 10/2014 |
| JP | 2015176946 A | 10/2015 |
| JP | 2016001735 A | 1/2016 |
| JP | 2016072515 A | 5/2016 |
| JP | 2016-524344 A | 8/2016 |
| JP | 2016171188 A | 9/2016 |
| JP | 2017092449 A | 5/2017 |
| JP | 2017108111 A | 6/2017 |
| JP | 2017168819 A | 9/2017 |
| JP | 2017228604 A | 12/2017 |
| JP | 2018056552 A | 4/2018 |
| JP | 2018088468 A | 6/2018 |
| JP | 2018-148075 A | 9/2018 |
| WO | 2012111292 A1 | 8/2012 |
| WO | 2013061511 A1 | 5/2013 |
| WO | 2015004577 A1 | 1/2015 |

\* cited by examiner

LIGHT EMITTING DEVICE

CROSS-REFERENCE TO RELATED APPLICATION

This application claims priority to Japanese Patent Application No. 2018-183357 filed on Sep. 28, 2018, the disclosure of which is hereby incorporated herein by reference in its entirety.

BACKGROUND

The present disclosure relates to a light emitting device.

Semiconductor light emitting elements have been used in recent years not only as illumination light sources that replace fluorescent lamps, but also as light sources having good directivity and high luminance in automotive headlights and other such projectors, flood lighting, and so forth.

It has been proposed that the desired light distribution can be obtained with a light emitting device used in such applications in the case where it includes a plurality of light emitting elements and the light emitting elements are turned on and off individually (For example, JPA 2014-197690).

SUMMARY in order to obtain the desired light distribution, there is a need for a light emitting device which has a more pronounced brightness difference when adjacent light emitting surfaces are in an on or off state.

The present disclosure includes the following aspects.

A light emitting device includes a plurality of light emitting elements each including a light extraction surface, a plurality of phosphor layers each covering the light extraction surface of a corresponding one of the light emitting elements with a larger plane area than the light extraction surface, and a plurality of light transmissive members. Each of the light transmissive members has a lower surface facing a corresponding one of the phosphor layers and having a larger plane area than the light extraction surface of a corresponding one of the light emitting elements, an upper surface having a larger plane area than the lower surface, and a side surface having a vertical surface portion contiguous with the upper surface. The light reflecting member surrounds the side surface of each of the light transmissive members.

Certain embodiments in the present disclosure can realize the light emitting device in which the luminance difference between the on/off state of the light emitting surface is steep.

DETAILED DESCRIPTION

The drawings referred to in the following description schematically show embodiments and, therefore, the scale, interval, positional relationship and the like of members may be exaggerated or partially omitted. Further, a plan view and a corresponding cross-sectional view may not coincide with each other in scale or interval of members. Further, in the following description, in principle, identical name and reference character denote an identical or similar member, and the detailed description thereof may be omitted as appropriate.

Light Emitting Device

Figure 1:
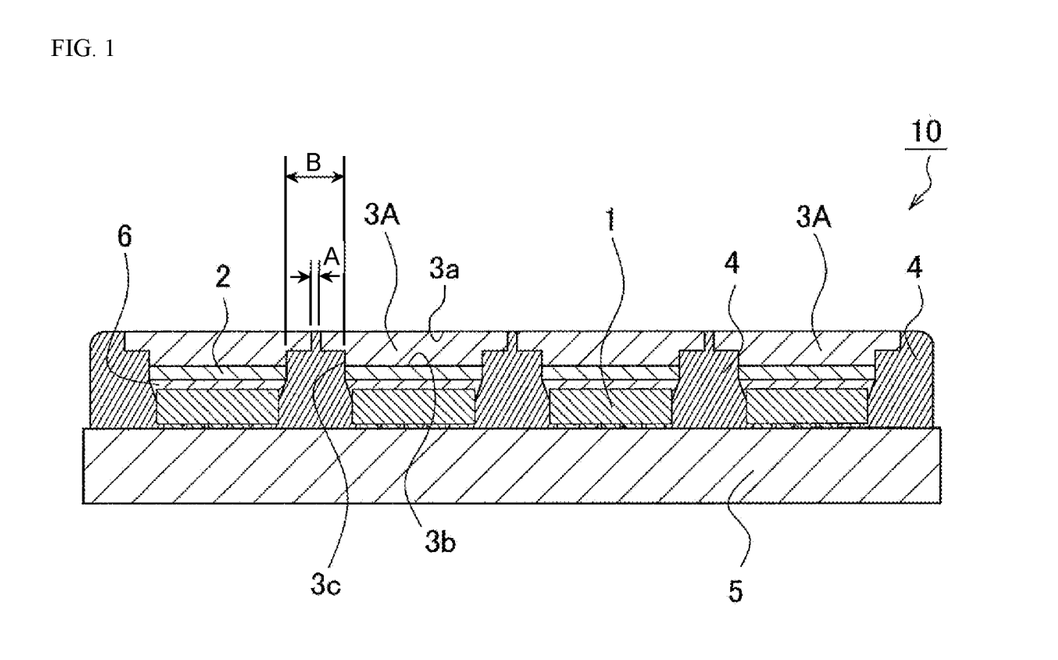
FIG. 1 is a cross-sectional view schematically showing a light emitting device according to an embodiment of the present disclosure.

As shown in FIG. 1, the light emitting device in an embodiment of the present disclosure includes a plurality of light emitting elements 1 whose upper surface is a light extract surface; a phosphor layer 2 that covers the light extract surface in a larger plane area (i.e., horizontal projecting plane area) than the light extract surface of the light emitting elements; a light transmissive member 3 including a lower surface 3b that is opposite (facing) the phosphor layer 2 and has a larger plane area than the light extract surfaces of the light emitting elements, an upper surface 3a that has a larger plane area than the lower surface 3b, and a side surface 3c that has a vertical surface portion that is contiguous with the upper surface 3a; and a light reflecting member 4 that collectively surrounds the plurality of light emitting elements 1. The light emitting device 10 includes the light transmissive member 3 on the upper surfaces of the plurality of light emitting elements. The upper surfaces of the light transmissive member 3 are exposed from the light reflecting member 4 and constitute the light emitting surfaces of the light emitting device 10. In this specification, the term "perpendicular" encompasses a situation in which one surface forms an angle of about 90°±5° with respect to another surface.

With a configuration such as one shown in FIG. 1, in the light emitting device 10 having a plurality of light emitting surfaces, the distance between adjacent light emitting surfaces can be made shorter than the distance between adjacent light emitting elements and the distance between adjacent phosphor layers. Furthermore, by making the phosphor layer 2 thinner, or more specifically, by making the phosphor layer 2 thinner than the light transmissive member 3, the light that is emitted from the light emitting elements and is incident on the phosphor layer will be less likely to propagate laterally. That is, it is possible to suppress light from leaking to the phosphor layer disposed on an adjacent light emitting element. As a result, it is possible to obtain a light emitting device in which there is a pronounced difference in brightness between the on and off states of adjacent light emitting surfaces.

Light Emitting Element 1

Light emitting diodes are usually used as for light emitting elements 1. A plurality of the light emitting elements 1 are included in one light emitting device.

The composition, emission color and wavelength, size, number, and so forth of the light emitting elements can be suitably selected according to the intended use. For example, blue and green light emitting elements can use semiconductor layers such as ZnSe, nitride-based semiconductor (In$_x$AlYGa1−x−YN, $0 \leq X$, $0 \leq Y$, $X+Y \leq 1$), GaP, red light emission can use semiconductor layers such as GaAlAs or AlInGaP.

The light emitting elements are usually formed by laminating a semiconductor layer on a light transmissive support substrate (such as a sapphire substrate). The substrate becomes the upper surface side of the light emitting element, and is the main light extract surface of the light emitting element. The support substrate may be textured on the joining surface with the semiconductor layer. This allows for an intentional change to the critical angle of the light emitted from the semiconductor layer when it hits the substrate, so the light can be easily taken off to outside the substrate.

The support substrate of the light emitting element may be removed after lamination of the semiconductor layer. This removal can be accomplished, for example, by polishing, LLO (laser lift off), or the like. When the support substrate is removed, the surface of the semiconductor layer closest to the support substrate becomes the upper surface of the light emitting element, and is the main light extract surface of the light emitting element.

The light emitting element preferably has a pair of positive and negative electrodes on the same side. This allows the light emitting element to be flip-chip mounted on a mounting substrate. The surface opposite the surface on which the pair of electrodes is formed becomes the light extract surface.

The number of light emitting elements 1 can be appropriately set as dictated by the characteristics, size, and so forth of the light emitting device to be obtained. The plurality of light emitting elements 1 are preferably arranged close to one another. When the luminance distribution of the light emitting device 10 and its use in an automotive application are taken into account, the distance between adjacent light emitting elements is preferably less than the size of an individual light emitting element (for example, the length of one side). About 30% or less of the size of the light emitting element itself is preferable, and 20% or less is more preferable. The light emitting elements 1 are preferably arranged regularly on a substrate 5 having wiring on its surface, for example.

Substrate 5

The light emitting elements 1 are disposed on the substrate 5 as shown in FIG. 1.

Figure 4:
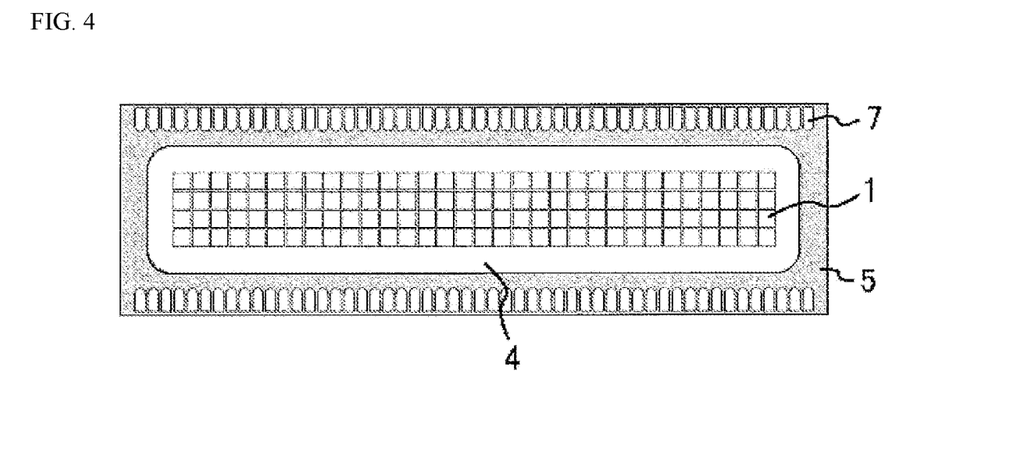
FIG. 4 is a plan view schematically showing the light emitting device according to the embodiment of the present disclosure.

The substrate 5 can be any substrate that is known in the art for use in mounting the light emitting elements 1 or the like. Examples include glass epoxy, resin, ceramic, or another such insulating member, and metal members having an insulating member formed on their surface. Of these, a ceramic having high heat resistance and weather resistance is preferable. Examples of ceramic materials include alumina, aluminum nitride, and mullite. These ceramic materials may be combined with an insulating material such as BT resin, glass epoxy, epoxy resin, or the like. As shown in FIG. 4, the substrate 5 is usually one having wiring 7 connected to the light emitting elements 1 on its surface. The light emitting elements 1 may be arranged randomly or in a row on the substrate 5 as shown in FIG. 1, for example, or may be arranged in a matrix as shown in FIG. 4. It is particularly preferable for the light emitting elements 1 to be arranged in a matrix.

The wiring on the substrate 5 is formed so as to allow the plurality of light emitting elements 1 disposed on the substrate 5 to be driven as needed. It is particularly preferable for the plurality of light emitting elements 1 to be formed so that they can be individually driven.

Phosphor Layer 2

Examples of the phosphor layer 2 include one obtained by mixing and molding a light transmissive material such as a sintered phosphor, a resin, glass, or an inorganic substance as a binder of the phosphor. The higher is the transparency of the phosphor layer 2, the more light can be reflected at the interface with the light reflecting (discussed below), so brightness can be increased.

The phosphor can be one that can be excited by the light from the light emitting element 1. For example, one of the specific examples shown below can be used alone, or two or more can be used in combination. As a phosphor that can be excited by a blue light emitting element or an ultraviolet light emitting element, a yttrium-activated garnet-based phosphor activated with cerium (e.g., $Y_3(Al, Ga)_5O_{12}$:Ce), a lutetium-aluminum activated with cerium Garnet-based phosphors (e.g., $Lu_3(Al, Ga)_5O_{12}$:Ce), nitrogen-containing calcium aluminosilicate phosphors activated by europium and/or chromium (e.g., $CaO-Al_2O_3-SiO_2$:Eu), europium-activated Silicate-based phosphors (e.g., $(Sr, Ba)_2SiO_4$:Eu), β-sialon-based phosphors (e.g., $Si_{6-z}Al O_zN_{8-z}$:Eu ($0<Z<4.2$)), Nitride-based fluorescence such as CASN-based phosphors (e.g., $CaAlSiN_3$:Eu), SCASN-based phosphors (e.g., $(Sr, Ca)AlSiN_3$:Eu), and manganese-activated potassium fluorosilicate phosphors (e.g., $K_2SiF_6$:Mn), sulfide phosphors, quantum dot phosphors, etc. The phosphor can be combined with a blue light emitting element or an ultraviolet light emitting element to obtain a light emitting device with the desired emission color (such as a white light emitting device). In the case of a light emitting device capable of emitting white light, the type and concentration of the phosphor contained in the phosphor layer 2 are adjusted to obtain white light. When such a phosphor is contained in a light transmissive material, the concentration of the phosphor is preferably about 30% to 80%, for example.

The phosphor layer 2 is disposed to cover the light extract surfaces of the light emitting elements 1. The phosphor layer 2 is preferably joined to the light emitting elements 1 so as to cover the light extract surfaces. The phosphor layer 2 and the light emitting elements 1 can be joined, for example, by press bonding, sintering, bonding with a known adhesive such as epoxy or silicone, bonding with a high refractive index organic adhesive, bonding with a low melting point glass, etc. The adhesive agent or other material used for joining is preferably light transmissive material. The term "light transmissive" here means that 60%, and preferably 70% or more, of the light from the light emitting elements is transmitted. The material used for joining is preferably disposed in a thickness close to 0 μm between the light extract surface of the light emitting elements and the phosphor layer. The thickness of the adhesive between the light extract surface of the light emitting elements and the phosphor layer is, for example, 10 μm or less, more specifically about 3 μm to 7 μm. Also, the adhesive may be disposed to further cover the side surfaces of the light emitting elements. In this case, it is preferably disposed so as to spread out like a fillet from the side surfaces of the light emitting elements to the lower surface of the phosphor layer.

The adhesive may contain a diffusion material, the above-mentioned phosphor, and the like.

The plane area of the phosphor layer 2 is preferably equal to or greater than the plane area of the light extract surfaces of the light emitting elements 1. Consequently, when an adhesive is used for joining the light emitting elements and the phosphor layer, the adhesive can be prevented from wetting and creeping up to the side surfaces of the phosphor layer. An example of the plane area is 100% to 130% of the light extract surfaces of the light emitting elements 1, with 103% to 120% being preferable, and 104% to 110% even better. With the light emitting device 10, it is preferable for the entire outer edge of the phosphor layer 2 to be disposed flush with the outer edge of the light emitting elements 1 or outside the outer edge in plan view, and more preferable for the entire outer edge of the phosphor layer 2 to be disposed outside the outer edge of the light emitting elements 1 in plan view. A disposition such as this allows the light emitted from the light extract surfaces of the light emitting elements 1 to be efficiently incident on the phosphor layer 2.

The thickness of the phosphor layer 2 can be appropriately set depending on the material constituting the phosphor layer, the amount of phosphor contained, and so forth. It is especially preferable for the phosphor layer 2 to be a thin layer, preferably 50 μm or less, and more preferably 40 μm or less. Taking into consideration that the phosphor will be contained in an amount required for wavelength conversion, the thickness of the phosphor layer 2 is preferably about 30 μm to 40 μm, for example. Such a thickness suppresses the propagation of light in the lateral in which the path physically narrows. This makes it less likely that light will propagate to an adjacent phosphor layer.

The phosphor layer 2 can be formed into a plate shape using the above-mentioned materials and divided into the desired shape. In addition, the phosphor layer 2 may be formed on one side of the light transmissive member 3 (discussed below) by printing, coating, spraying, or the like to form a laminate of the phosphor layer 2 and the light transmissive member 3.

Light Transmissive Member 3

The light transmissive member 3 is a member capable of transmitting the light emitted from the phosphor layer 2 and emitting the light to the outside.

The light transmissive member 3 has an upper surface 3a and a lower surface 3b that faces the upper surface 3a. The lower surface 3b is the surface on which light from the phosphor layer 2 is incident, and is disposed facing the phosphor layer 2. The upper surface 3a is the surface that constitutes the light emitting surface of the light emitting device 10, and is the surface that emits the light from the light emitting element 1 and the light whose wavelength is converted by the phosphor layer 2 to the outside. The plane area of the lower surface 3b of the light transmissive member 3 facing the phosphor layer 2 is preferably equal to or greater than the plane area of the upper surface of the phosphor layer. An example of the plane area of the upper surface of the phosphor layer is 100% to 110%. In other words, the outer edge of the lower surface 3b of the light transmissive member 3 preferably surrounds the outer edge of the upper surface of the phosphor layer 2. More specifically, the outer edge of the lower surface 3b of the light transmissive member 3 may be disposed about 0 to 20 μm outside of the outer edge of the upper surface of the phosphor layer 2. This allows the light transmissive member 3 to cover all of the light extract surfaces of the light emitting elements 1 and all of the upper surface of the phosphor layer.

The upper surface 3a of the light transmissive member 3 has a larger plane area than the lower surface 3b. For example, the plane area of the upper surface 3a of the light transmissive member 3 may be from 105% to 140% of the plane area of the lower surface. Also, it is more preferable for the outer edge of the upper surface 3a of the light transmissive member 3 to be disposed more to the outside than the outer edge of the lower surface 3b in plan view. This makes it possible for the distance between the adjacent light transmissive members 3 to be made shorter than the distance between the corresponding light emitting elements, and makes it possible for the plurality of light emitting surfaces of the light emitting device 10 to be disposed closer together, so a more compact light emitting device 10 can be obtained.

The upper surface 3a and the lower surface 3b of the light transmissive member 3 are preferably flat surfaces and are parallel to each other. Here, the term "parallel" encompasses that either one of the upper surface 3a and the lower surface 3b is allowed to be inclined by about ±5 with respect to the other. With a shape such as this, it is possible to obtain a light emitting device with uniform front luminance and little color unevenness at the upper surface 3a of the light transmissive member 3, which serves as the light emitting surface.

Figure 2A:
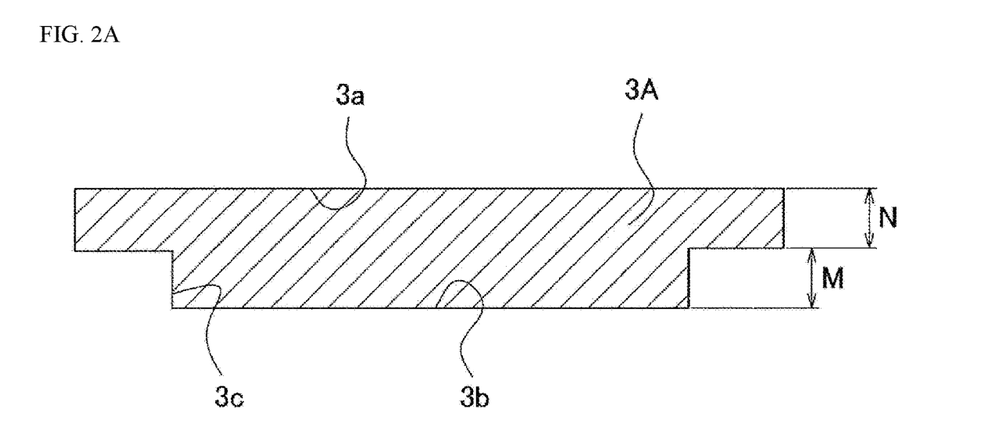
FIG. 2A is a cross-sectional view schematically showing a first example of a light transmissive member used in the light emitting device in the embodiment of the present disclosure.
Figure 2B:
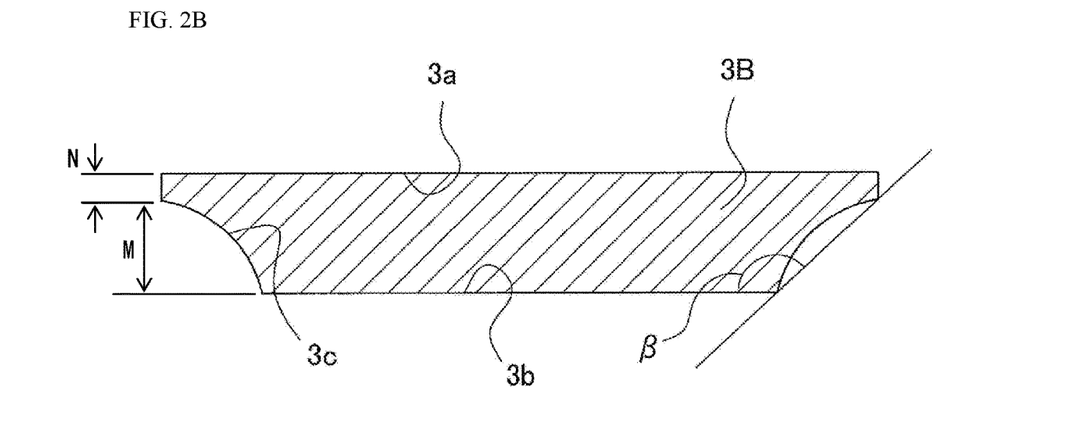
FIG. 2B is a cross-sectional view schematically showing a second example of the light transmissive member used in the light emitting device in the embodiment of the present disclosure.

The upper surface 3a of the light transmissive member 3 has a larger plane area than the lower surface 3b. As shown in FIGS. 2A to 2D, the side surfaces 3c in between the upper surface 3a and the lower surface 3b of the light transmissive member 3 have a vertical surface (a vertical surface portion) perpendicular to the upper surface 3a on the upper surface 3a side. Furthermore, the side surfaces 3c are provided with a portion that spreads outward from the lower surface 3b gradually, stepwise, or sharply toward the upper surface 3a, on a part of the lower surface side. For example, as shown in FIGS. 1 and 2A, the side surfaces 3c in between the upper surface 3a and the lower surface 3b of a light transmissive member 3A may include one convex component on the upper surface side, or one concave component on the lower surface side. As shown in FIGS. 2B and 3, the side surfaces 3c in between the upper surface 3a and the lower surface 3b of a light transmissive member 3B may have a side surface including, a vertical surface and a concave portion from the lower surface to the upper surface, more specifically, a vertical surface perpendicular to the upper surface 3a on the upper surface 3a side, and a curved surface in contact with the lower surface 3b below the vertical surface. The curved surface here may be either concave protruding on the inside as shown in FIG. 2B or convex, which is one protruding on the outside. As shown to FIG. 2C, the light transmissive member 3C may have side surfaces 3c having a vertical surface perpendicular to the upper surface 3a on the upper surface 3a side, and an inclined surface below the vertical surface. As shown to FIG. 2D, the light transmissive member 3D may have side surfaces 3c having a plurality of steps from the upper surface 3a to the lower surface 3b. If the light transmissive member 3 has side surfaces with shapes such as these, there will be less light leakage in the lateral direction, and the distance between the upper surfaces of the adjacent light transmissive members can be shorter. Consequently, a light emitting device can be obtained that is compact and in which the there is a pronounced luminance difference between the on and off states of the light emitting elements.

In one embodiment, the vertical surface of the side surface 3c of the light transmissive member 3 that is in contact (contiguous) with the upper surface 3a is preferably a flat surface. This makes it less likely that the light reflecting member covering the side surfaces 3c of the light transmissive member will wet and spread up to the upper surface 3a.

Figure 2C:
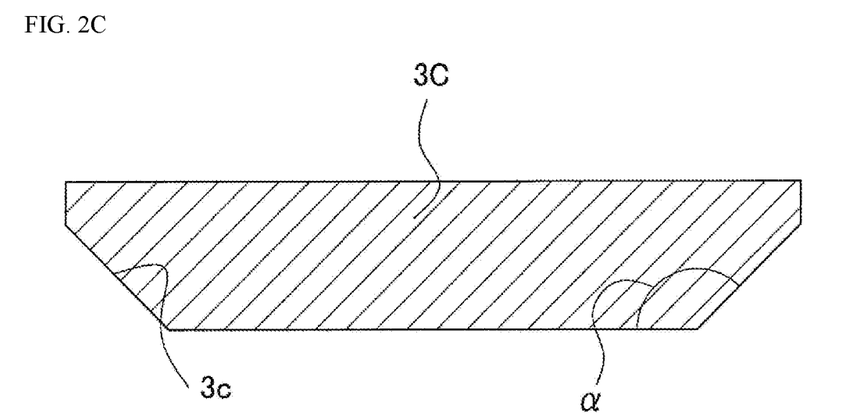
FIG. 2C is a cross-sectional view schematically showing a third example of the light transmissive member used in the light emitting device in the embodiment of the present disclosure.
Figure 2D:
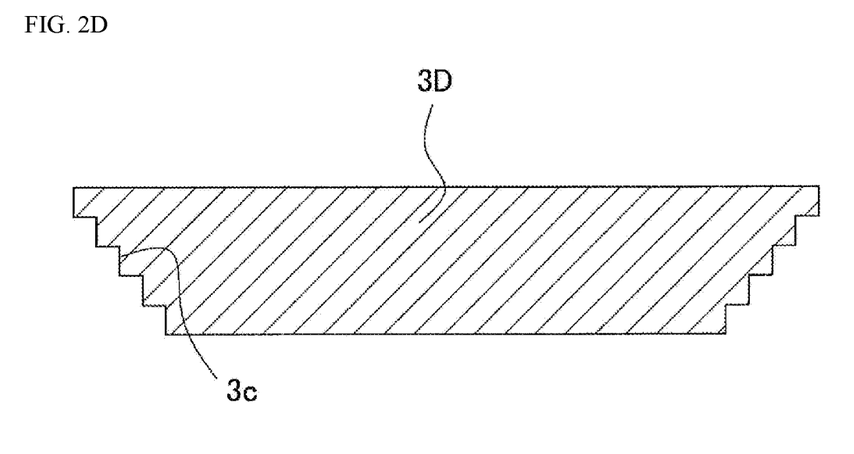
FIG. 2D is a cross-sectional view schematically showing a fourth example of the light transmissive member used in the light emitting device in the embodiment of the present disclosure.
Figure 3:
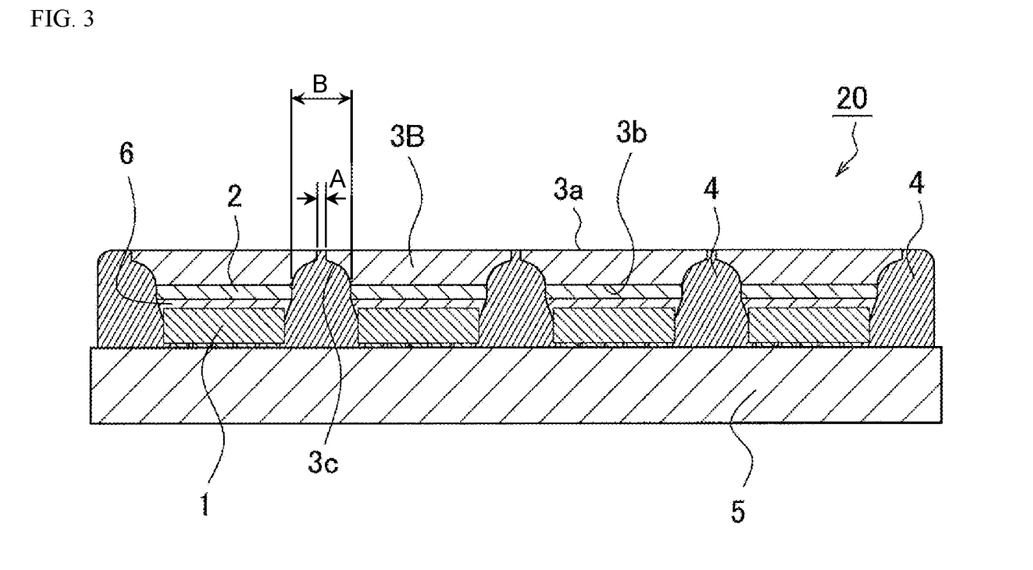
FIG. 3 is a cross-sectional view schematically showing the second example of the light transmissive member used in the light emitting device in the embodiment of the present disclosure.

As shown in FIG. 2C, when the side surfaces 3c have an inclined surface in contact with the lower surface, the inclination angle α can be 75° to 85°, for example. As shown in FIG. 2B, when the side surfaces 3c include a curved surface, a straight line connecting the upper end and the lower end of the curve can be used as the inclination angle β in a cross sectional view, and the inclination angle β can be 75° to 85°, for example.

The thickness of the light transmissive member 3 (the height from its lower surface to its upper surface; M+N in FIG. 2A), is 50 µm to 500 µm, for example, with 70 µm to 300 µm being preferable. Also, the vertical length of the vertical surface (N in FIG. 2A) may be 10% to 90% of the thickness of the light transmissive member 3, with 30% to 55% being preferable.

A light transmissive member 3 with such a shape can be formed by providing a plate-like light transmissive member, and appropriately selecting the angle and the width of the blade used to dividing the light transmissive member into individual pieces, etc., and the dicing method can be a combination of half dicing and division, etc. The division step and the side surface machining step may be performed as separate steps, division may be followed by machining into a shape such as this.

The lower surface of the light transmissive member 3 is preferably joined to the upper surface of the phosphor layer 2. The light transmissive member 3 and the phosphor layer 2 can be joined by a method such as affixing or bonding the phosphor layer 2 to the light emitting element 1. In particular, it is preferable for the phosphor layer 2 to be formed by printing on the lower surface of the light transmissive member 3.

A laminate of the phosphor layer 2 and the light transmissive member 3 can be obtained by forming the phosphor layer 2 on one side of the plate-like light transmissive member 3, and then performing machining as discussed above from the phosphor layer 2 side. This allows the phosphor layer 2 and the light transmissive member 3 both to be placed at the same time on the light emitting elements, so the manufacturing process can be simplified.

The light emitting device 10 includes a plurality of light transmissive members 3. The upper surfaces of the light transmissive members 3 constitute the light emitting surfaces of the light emitting device 10, and are arranged in orderly fashion on the upper surface of the light emitting device 10. One light transmissive member 3 is disposed on one or more light emitting elements, and adjacent light transmissive members are separated from each other. In this case, the distance between adjacent ones of the upper surfaces of the light transmissive members (the distance A in FIGS. 1 and 3) is shorter than the distance between the adjacent ones of the lower surfaces of the light transmissive members (the distance B in FIGS. 1 and 3). More specifically, the distance between the upper surfaces of the light transmissive members may be 30 µm to 100 µm, with 50 µm to 70 µm being preferable.

In a light emitting device in which a plurality of light emitting elements are arranged close to each other, if each of the plurality of light emitting elements includes a laminate of the light transmissive member 3 and the phosphor layer 2 in the shape described above, then when the light emitting elements are partially lit (i.e., only some of the light emitting elements are turned on), it will be possible to suppress light leakage to the light transmissive members located on the light emitting elements that are turned off and are adjacent to the light emitting elements that are turned on, on the light emitting surface side of the light emitting device. This makes it possible to obtain a light emitting device in which there is a pronounced luminance difference between the light emitting portions and the non-light emitting portions.

Light Reflecting Member

As shown in FIG. 1, the light emitting device includes a light reflecting member 4 that surrounds the side surfaces of the light transmissive member 3. It is preferable if the light reflecting member 4 surrounds not only the side surfaces of the light transmissive member 3, but also the side surfaces of the phosphor layer 2 and the light emitting elements 1. It is particularly preferable in the case where this light reflecting member surrounds the entire side surfaces of the light emitting elements and the phosphor layer and at least part of the side surfaces of the light transmissive member. In other words, the upper surface of the light transmissive member may protrude from the upper surface of the light reflecting member (i.e., the upper surface of the light transmissive member may be positioned higher than the upper surface of the light reflecting member). Furthermore, it is preferable if the light reflecting member 4 is in contact with and surrounds the entire side surfaces of the phosphor layer and the light transmissive member. However, if the light reflecting member 4 surrounds the light emitting elements 1 and the phosphor layer 2, it may surround them via the above-mentioned materials used for affixing or bonding.

In general, the light emitted from the upper surface of the light transmissive member, which is the light emission surface, also spreads out in the lateral direction. If the upper surface of the light reflecting member is higher than the upper surface of the light transmissive member, the light emitted from the upper surface of the light transmissive member will be reflected by the light reflecting member, causing variance in the light distribution. On the other hand, the emitted light can be taken off directly to the outside by covering the side surfaces of the light transmissive member with the light reflecting member while lowering the height of the light reflecting member that covers the outer periphery of the side surfaces.

The light reflecting member is formed from a material that can reflect the light emitted from the light emitting elements. Consequently, the light emitted from the light emitting elements is reflected within the light transmissive member, the phosphor layer, or the light emitting elements at the interface between the light transmissive member, the phosphor layer, or the light emitting elements and the light reflecting member, and this allows the light to be efficiently emitted from the upper surface of the light transmissive member to the outside.

The light reflective member is preferably made of an insulating material, and can be formed using, for example, a resin material. Examples of the resin material include resins or hybrid resins containing one or more of silicone resin, modified silicone resin, epoxy resin, modified epoxy resin, acrylic resin, phenol resin, and fluorine resin. The light reflective member can be formed by incorporating these resin materials with a reflective material. The reflective material may, for example, be titanium oxide, silicon oxide, zirconium oxide, potassium titanate, alumina, aluminum nitride, boron nitride or mullite.

Since the amounts of light reflection and transmission, etc., of the light reflecting member can be varied depending on the distance between adjacent light transmissive members, the amount in which the reflective material is contained can be suitably adjusted as dictated by the characteristics of the light emitting device to be obtained, etc. For example, it is preferable for the content of the reflective substance to be at least 30 wt % with respect to the total weight of the light reflecting member, and for the thickness thereof to be at least 50 µm, and more preferably at least 100 µm.

The light reflecting member can be molded by injection molding, potting, resin printing, transfer molding, compression molding, or the like.

The light emitting device disclosed herein may be equipped with a protective element or other such electronic components. If an electronic component is embedded in the light reflecting member 4, this will prevent a decrease in light extract that would otherwise be caused by the absorption of the light from the light emitting elements by the electronic component, or by blockage of the light by the electronic component.

Contrast Evaluation

The light emitting device 20 shown in FIG. 3 was produced using the light transmissive member 3B shown in FIG. 2B, and the contrast was measured.

In the light emitting device 20, a plurality of light emitting elements 1 (size: 0.6 mm×0.6 mm) are mounted in a matrix on a substrate 5. The substrate 5 is obtained by depositing a pattern of titanium, palladium, or gold as the wiring 7 on the surface of an aluminum nitride plate (thickness of 1.0 mm) having a thermal conductivity of about 170 W/m·K, and then gold plating over this. The light emitting elements are flip-chip mounted by bumps made of gold.

The light extract surfaces of the light emitting elements 1 are covered with a laminate of the phosphor layer 2 and the light transmissive member 3. The phosphor layer 2 is formed of a resin layer containing 5 wt % to 10 wt % YAG phosphor, and in a size of 610 µm×610 µm×35 µm (thickness). The lower surface of the phosphor layer 2 and the upper surface of the light emitting elements 1 are joined using a light transmissive adhesive composed of a silicone resin. The outer edge of the lower surface of the phosphor layer 2 is located to the outside of the outer edge of the light extract surface of the light emitting elements 1, and the phosphor layer 2 covers the entire light extract surfaces of the light emitting elements 1. The light transmissive member 3 is made of glass, and as shown in FIG. 2B, has vertical surfaces in contact with the upper surface 3a, and side surfaces 3c having a concave curved surface in contact with the lower surface 3b. The total thickness including the height N of the vertical surface and the height M of the curved surface is 100 µm, and the height N of the vertical surface and the height M of the concave surface are both 50 µm. The upper surface 3a of the light transmissive member 3A measures 650 µm×650 µm, and the lower surface 3b measures 610 µm×610 µm. The phosphor layer 2 is formed as a printing layer on the lower surface 3b in a plane area substantially the same as that of the lower surface 3b of the light transmissive member 3.

The side surfaces of the light emitting elements 1, the phosphor layer 2, and the light transmissive member 3 are covered with the light reflecting member 4. The adhesive 6 with the phosphor layer is disposed on the side surfaces of the light emitting elements 1 so as to spread out like a fillet from the side surfaces of the light emitting elements 1 to the lower surface of the phosphor layer, and the side surfaces of the light emitting elements 1 are covered by the light reflecting member 4 via this adhesive 6. The light reflecting member 4 contains 30 wt % titanium oxide contained in a silicone resin.

The light reflecting member 4 is substantially flush with the upper surface 3a of the light transmissive member 3.

The distance between adjacent light transmissive members 3 on the light emitting surface side is about 70 µm.

As another example of the light emitting device according to the embodiment, the light emitting device having the same configuration as the light emitting device 20 as described above was produced, except that the height M of the concave surface of the light transmissive member in the light emitting device was changed to 95 µm and the total thickness to 145 µm.

Also, for the sake of comparison, for each of the light emitting devices 20 with the light transmissive members of different thicknesses as described above, a comparative light emitting device A (thickness of light transmissive member: 100 µm) and a comparative light emitting device B (thickness of light transmissive member: 145 µm) having the same configuration were produced, except that the light transmissive member in the comparative light emitting devices A and B has a flat shape measuring 650 µm×650 µm with flat side surfaces.

In each of these light emitting devices, just one light emitting element was turned on, and the luminance of the light emitting surface was measured for the lit light emitting element and the adjacent light emitting element. As a result, with the light emitting device 10 in which the light transmissive member had a shape such that the plane area of the upper surface was larger than the plane area of the lower surface (thickness: 100 µm), the luminance ratio of the lit light emitting element to the unlit light emitting element is 110:1, which was significantly better than the contrast 97:1 of the comparative light emitting device A in which a flat light transmissive member of the same thickness was used.

Also, with the light emitting device 30 in which the light transmissive member had a shape such that the plane area of the upper surface was larger than the plane area of the lower surface, the contrast between the lit light emitting element and the unlit light emitting element was 106:1, which was significantly better than the contrast 100:1 of the comparative light emitting device B in which a flat light transmissive member of the same thickness was used.

The result was evaluated by the average value from the result measured in two of the light emitting devices.

For example, when a light emitting device is incorporated into a headlight or the like, it is important to prevent unnecessary light from illuminating unnecessary portions, to avoid glare, and to make the boundary between the light emitting portions and non-light emitting portions distinct (i.e., good pronounced difference in brightness between the light emitting portion and the non-light emitting portion).

With the light emitting device in one embodiment of the present application, the distance between the light emitting surfaces is set to the minimum, while lateral propagation of the light emitted from the light emitting elements and incident on the phosphor layer and the light transmissive member is suppressed, and lateral light leakage can be reliably prevented. As a result, an even more compact light emitting device can be obtained, while achieving a high contrast in which there is a pronounced difference in brightness between on and off light emitting elements, or between the light emitting portions (light extract surfaces of the light emitting elements) and the non-light emitting portions (between the light emitting elements).

The light emitting device of the present disclosure can be used for various light sources such as illumination light sources, light sources for various indicators, light sources for vehicles, light sources for displays, light sources for backlight of liquid crystals, traffic lights, vehicle parts, and channel letters for billboards.

What is claimed is:

1. A light emitting device comprising:
    a plurality of light emitting elements each including a light extraction surface;
    a plurality of phosphor layers each covering the light extraction surface of a corresponding one of the light emitting elements with a larger plane area than the light extraction surface;
    a plurality of light transmissive members each having
        a lower surface facing a corresponding one of the phosphor layers and having a larger plane area than the light extraction surface of a corresponding one of the light emitting elements,
        an upper surface having a larger plane area than the lower surface, the upper surface and the lower surface of each of the light transmissive members being parallel to each other, and
        a side surface having a vertical surface portion contiguous with the upper surface, the side surface including a concave portion extending from the lower surface to a lower end of the vertical surface portion; and
    a light reflecting member surrounding and in contact with an entirety of the side surface of each of the light transmissive members.

2. The light emitting device according to claim 1, wherein the light reflecting member surrounds the side surface of each of the light transmissive members and a side surface of each of the light emitting elements.

3. The light emitting device according to claim 1, wherein adjacent ones of the light transmissive members are separated from each other, and
    a distance between the upper surfaces of the adjacent ones of the light transmissive members is shorter than a distance between the lower surfaces of the adjacent ones of the light transmissive members.

4. The light emitting device according to claim 3, wherein the distance between the upper surfaces of the adjacent ones of the light transmissive members is 30 µm to 100 µm.

5. The light emitting element according to claim 1, further comprising
    the upper surface of each of the light transmissive members is positioned substantially flush with or higher than an upper surface of the light reflecting member.

6. The light emitting device according to claim 1, wherein an outer edge of each of the phosphor layers, outer edges of the lower surface and the upper surface of a corresponding one of the light transmissive members are located to an outside of an outer edge of a corresponding one of the light emitting elements, in a plan view.

7. The light emitting device according to claim 1, further comprising
    a substrate, wherein
    the light emitting elements are arranged in a matrix on the substrate.

8. The light emitting device according to claim 7, wherein the substrate has a wiring configured to drive the light emitting elements individually.

9. The light emitting device according to claim 1, wherein a thickness of each of the phosphor layers is about 30 µm to 40 µm.

10. The light emitting device according to claim 1, wherein
    a vertical length of the vertical surface portion of each of the light transmissive members is 30% to 55% of a thickness of each of the light transmissive members.

11. The light emitting device according to claim 1, wherein
    in each of the light transmissive members, a plane area of the upper surface is from 105% to 140% of a plane area of the lower surface.

12. The light emitting device according to claim 1, further comprising
    an adhesive member joining each of the light emitting elements with a corresponding one of the phosphor layers.

13. A light emitting device comprising:
    a plurality of light emitting elements each including a light extraction surface;
    a plurality of phosphor layers each covering the light extraction surface of a corresponding one of the light emitting elements with a larger plane area than the light extraction surface;
    a plurality of light transmissive members each having
        a lower surface facing a corresponding one of the phosphor layers and having a larger plane area than the light extraction surface of a corresponding one of the light emitting elements,
        an upper surface having a larger plane area than the lower surface, the upper surface and the lower surface of each of the light transmissive members being parallel to each other, and
        a side surface having a vertical surface portion contiguous with the upper surface;
    a light reflecting member surrounding and in contact with an entirety of the side surface of each of the light transmissive members; and
    an adhesive member joining each of the light emitting elements with a corresponding one of the phosphor layers, the adhesive member being spaced apart from a corresponding one of the light transmissive members.

14. The light emitting device according to claim 13, wherein
    the side surface of each of the light transmissive members includes a concave portion extending from the lower surface to a lower end of the vertical surface portion.

15. The light emitting device according to claim 13, wherein
    the light reflecting member surrounds the side surface of each of the light transmissive members and a side surface of each of the light emitting elements.

16. The light emitting device according to claim 13, wherein
    adjacent ones of the light transmissive members are separated from each other, and
    a distance between the upper surfaces of the adjacent ones of the light transmissive members is shorter than a distance between the lower surfaces of the adjacent ones of the light transmissive members.

17. The light emitting element according to claim 13, further comprising
    the upper surface of each of the light transmissive members is positioned substantially flush with or higher than an upper surface of the light reflecting member.

18. The light emitting device according to claim 13, wherein
an outer edge of each of the phosphor layers, outer edges of the lower surface and the upper surface of a corresponding one of the light transmissive members are located to an outside of an outer edge of a corresponding one of the light emitting elements, in a plan view.

19. The light emitting device according to claim 13, further comprising
a substrate, wherein
the light emitting elements are arranged in a matrix on the substrate.

20. The light emitting device according to claim 19, wherein
the substrate has a wiring configured to drive the light emitting elements individually.

* * * * *